United States Patent [19]

Marr et al.

[11] Patent Number: 5,121,420

[45] Date of Patent: Jun. 9, 1992

[54] AUTOMATIC LINE DEFECT DETECTOR

[75] Inventors: Michael R. Marr, Redwood City; Robert C. Boden, San Jose; Jakie B. Boyd, Santa Clara, all of Calif.

[73] Assignee: Rolm Systems, Santa Clara, Calif.

[21] Appl. No.: 583,895

[22] Filed: Sep. 17, 1990

[51] Int. Cl.⁵ .................. H04M 1/24; H04M 3/30; G01R 31/11

[52] U.S. Cl. .................. 379/26; 379/29; 324/533; 324/535

[58] Field of Search .................. 379/22, 21, 27, 29; 324/533, 534, 535, 539

[56] References Cited

U.S. PATENT DOCUMENTS 4,104,582  8/1978  Lambertsen ................. 379/26

Primary Examiner—Stafford D. Schreyer
Attorney, Agent, or Firm—Michael B. Einschlag

[57] ABSTRACT

Method and apparatus for detecting and sectionalizing troubles on telephone lines automatically. Specifically, an embodiment for detecting and sectionalizing troubles on a telephone line connecting a switching machine and a subscriber telephone set connected thereto over the telephone line, includes apparatus which: (a) emits a pulse over the telephone line; (b) detects reflections of the pulse; and (c) and determines whether a reflection was received prior to the expiration of a predetermined time period. The predetermined period relates to a distance which is less than the length of the telephone line between the switching machine and the subscriber telephone set.

9 Claims, 8 Drawing Sheets

AUTOMATIC LINE DEFECT DETECTOR

TECHNICAL FIELD OF THE INVENTION

The present invention pertains to method and apparatus for detecting defects in telephone lines and, in particular, to method and apparatus for automatically detecting defects in telephone lines between a switch and a subscriber telephone set.

BACKGROUND OF THE INVENTION

At present, certain telephony systems comprise: (a) telephone switching machines such as digital switching machines—one example of such telephone digital switching machines being a computerized business exchange (CBX) manufactured by ROLM Systems of Santa Clara, Calif.; (b) subscriber telephone sets—one example of such subscriber telephone sets being a ROLMPhone digital subscriber telephone set manufactured by ROLM Systems; and (c) telephone lines which connect the subscriber telephone sets to the digital switching machines—one example of such telephone lines being a ROLMLink twisted pair of wires. In particular, in a telephony system wherein the digital switching machine is a CBX, a ROLMLink interface (RLI) card is used to interface several individual telephone lines with the CBX.

FIG. 1 shows a block diagram of a portion of the telephony system referred to above wherein RLI 110 interfaces ROLMLink 120 with CBX 100. In the embodiment shown in FIG. 1, ROLMLink 120 comprises a twisted pair of wires which connects RLI 110 to a distributing frame (not shown) and a twisted pair of wires which connects the distributing frame to ROLMPhone 140.

It is well known in the art that there is a need to detect the presence of troubles which occur in communications between CBX 100 and ROLMPhone 140 and, thereafter, to sectionalize automatically, i.e., to determine the location of such troubles. Presently available telephony systems fall short of satisfying the need to detect the presence of troubles because, in general, they do not have the capability to detect troubles automatically. In fact, in such presently available telephony systems, troubles are detected typically by users who have detected unsatisfactory communications when they have attempted to use the system. Additionally, presently available telephony systems fall short of satisfying the need to sectionalize troubles automatically once the troubles have been detected. In particular, such telephony systems cannot determine automatically whether the trouble exists in ROLMPhone 140 or in the telephone line connecting ROLMPhone 140 and CBX 100, which telephone line is comprised of ROLMLink 120.

As is well known to those of ordinary skill in the art, it is important to sectionalize troubles in order to direct a repair person to the part of the communications link in which a trouble exists. In addition, if the telephone line has discontinuities or other defects that could affect transmission it would be very useful to determine the approximate distance from the switching machine to the defect.

At present, sectionalization of troubles is performed as follows. ROLMPhone 140 is disconnected manually from ROLMLink 120 and a reflectometer is connected manually to ROLMLink 120 in its place. In operation, the reflectometer sends a pulse towards CBX 100 and the reflectometer displays the reflection of that pulse, i.e., the echo, on a visual display such as, for example, an oscilloscope display. The echo is then interpreted, in a manner which is well known to those of ordinary skill in the art, to determine whether a problem exists in the connection between the end of ROLMLink 120 and CBX 100. As one can readily appreciate, the described sectionalization procedure is time consuming, expensive, and is typically performed after a user's dissatisfaction with service has prompted him or her to report a trouble.

As a result of the above, there is a need for method and apparatus for detecting and sectionalizing troubles on telephone lines automatically.

SUMMARY OF THE INVENTION

Embodiments of the present invention advantageously satisfy the above-identified need in the art and provide method and apparatus for detecting and sectionalizing troubles on telephone lines automatically. Further, in accordance with a preferred embodiment of the present invention, such trouble detection and sectionalization is performed automatically prior to a user's making a call. This prior detection and sectionalization is advantageous because user satisfaction with service is increased.

In general, an embodiment of the present invention for detecting and sectionalizing troubles on a telephone line connecting a switching machine and a subscriber telephone set connected thereto over the telephone line, comprises apparatus which: (a) emits a pulse over the telephone line (b) detects reflections of the pulse; and (c) and determines whether a reflection was received prior to the expiration of a predetermined time period. In a preferred embodiment, the predetermined time period relates to a distance which is less than the length of the telephone line between the switching machine and the subscriber telephone set. Specifically, if the telephone line under test is operating properly, the reflection will be received from the telephone set and, as a result, the predetermined time period will have expired. However, if a reflection of the pulse is detected prior to the expiration of the predetermined time period, this indicates that the reflection was caused by a defect of some sort in the telephone line between the switching machine and the subscriber telephone set.

In further embodiments of the present invention, the time of receipt of the reflection is determined and this time of receipt is translated into a length which corresponds to the location of the defect, as a distance along the telephone line from the switching machine. For example, it should be clear to those of ordinary skill in the art that a counter which runs at 18 MHz can be used to provide a timing function which could provide a length measurement having an accuracy of approximately twenty-five (25) feet.

In still further embodiments of the present invention, the detection of such defects, the distance of the defects from the switching machine and, so forth, may be logged for subsequent display for repair personnel or they may be provided thereto in real time.

In yet still further embodiments of the present invention, in a telephone line which has several discontinuities, a measurement of the distance to the first such discontinuity is made by varying the length of the predetermined time period. Specifically, at first, the time period corresponds to a length which is just short of the telephone set. If a defect is detected, the time period is shortened and pulses are emitted until no reflection is detected prior to the expiration of the shortened time period. Then, by keeping track of this test sequence, one determines that the last time period which resulted in a received reflection before the expiration thereof corresponds to the first defect along the telephone line in the direction starting from the switching machine and traveling towards the telephone set. As one of ordinary skill in the art can readily appreciate, this latter embodiment is useful in estimating the distance to the end of an open telephone line.

BRIEF DESCRIPTION OF THE DRAWING

A complete understanding of the present invention may be gained by considering the following detailed description in conjunction with the accompanying drawing, in which.

DETAILED DESCRIPTION

Figure 1:
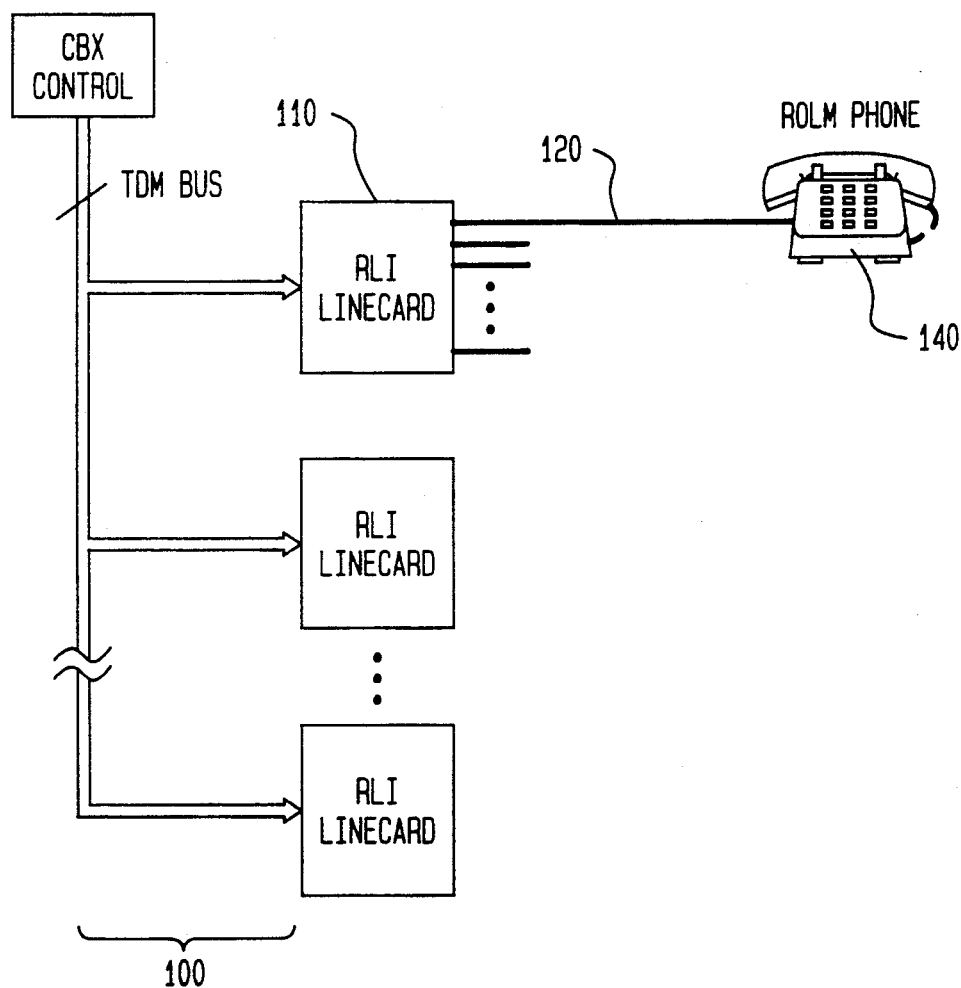
FIG. 1 is an block diagram of a telephony system which shows the interconnection between a subscriber telephone set and a switching machine.
Figure 2:
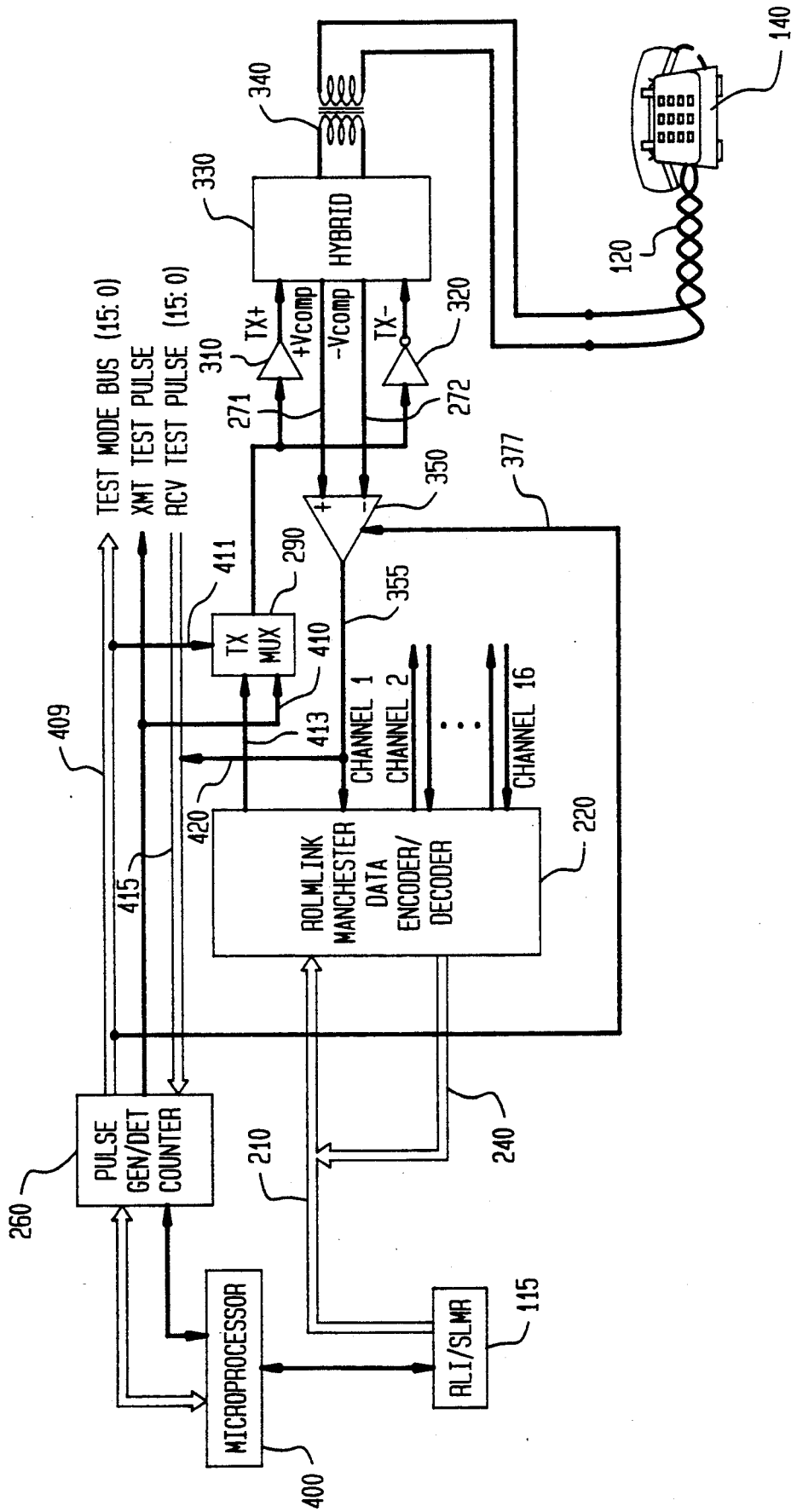
FIG. 2 is a block diagram of an embodiment of the present invention for use in detecting and sectionalizing troubles.

FIG. 2 is an block diagram of an embodiment of the present invention which comprises ROLMLink interface card 110. As shown in FIG. 2, RLI/SLMR 115 is a portion of ROLMLink interface card 110 which interfaces with CBX 100. CBX 100 is a computerized business exchange (CBX) switching machine which is manufactured by ROLM Systems of Santa Clara, Calif. and RLI/SLMR 115 is a card which interfaces sixteen (16) individual telephone lines with CBX 100, which card is also manufactured by ROLM Systems of Santa Clara, Calif.

As shown in FIG. 2, during normal communication between CBX 100 and ROLMPhone 140, RLI/SLMR 115 transmits digital output to ROLMlink Manchester data encoder/decoder 220 over leads 210 and receives digital input from ROLMlink Manchester data encoder/decoder 220 over leads 240. ROLMlink Manchester data encoder/decoder 220 is manufactured by ROLM Systems of Santa Clara, Calif. and encodes digital signals using the well known Manchester coding scheme and decodes Manchester encoded digital signals into well known logical digital signal formats.

As further shown in FIG. 2, during normal communication between CBX 100 and ROLMPhone 140, digital output from ROLMlink Manchester data encoder/decoder 220 to a particular one of the 16 subscriber lines is applied as input to the particular transmit multiplex for that channel, for example, transmit multiplex 290 (TX MUX 290), and digital output for that channel from the particular comparator for that channel, for example, comparator 350, is applied as input to ROLMlink Manchester data encoder/decoder 220. TX MUX 290 also receives a testmode address signal from microprocessor 400, which testmode address signal is relayed therefrom by pulse gen/det counter 260. TX MUX 290 is a multiplexer circuit which is well known to those of ordinary skill in the art for outputting either a signal applied as input thereto over lead 413 from ROLMLink Manchester data encoder/decoder 220 or a signal applied as input thereto over lead 410 from pulse gen/det counter 260. Note that FIG. 2 only shows one of the multiplicity of subscriber telephone sets which interface with RLI 110 for ease of understanding the operation of this embodiment of the present invention.

As still further shown in FIG. 2, in normal communication between CBX 100 and ROLMPhone 140, the output from ROLMLink Manchester data encoder/decoder 220 is applied as input to TX MUX 290 and TX MUX 290 applies this input, in turn, to amplifier 310 and to amplifier 320. As is well known to those of ordinary skill in the art, amplifiers 310 and 320 amplify the digital signal and provide digital signals TX+ and TX−, respectively, which digital signals are applied as input to hybrid network 330. Amplifiers 310 and 320 and hybrid network 330 are apparatus which are well known to those of ordinary skill in the art. The output from hybrid network 330 is applied as input to transformer 340, transformer 340 being apparatus which is well known to those of ordinary skill in the art, for applying signals to ROLMlink 120. Lastly, ROLMLink 120 is a twisted pair of wires which transmits the digital signals to ROLMPhone 140.

As yet still further shown in FIG. 2, in normal communication between CBX 100 and ROLMPhone 140, digital signals output by ROLMPhone 140 over ROLMlink 120 are applied as input to transformer 340 and transformer 340, in turn, applies them as input to hybrid network 330. The outputs from hybrid network 330, +Vcomp and −Vcomp, respectively, are applied as input to comparator 350. The digital signal output from comparator 350 is applied as input to ROLMlink Manchester data encoder/decoder 220.

Lastly, as was described briefly above, RLI/SLMR 115 interconnects a multiplicity of subscriber telephone sets over a multiplicity of individual telephone lines to CBX 100 and, in order to perform this interconnection function, RLI/SLMR 115 is comprised of apparatus which stores the length of each telephone line connected thereto. Further, RLI/SLMR 115 also comprises apparatus which determines the amount of delay which must be inserted into a signal which is transmitted to a predetermined telephone set so that the apparent distance of all subscriber telephone sets from CBX 100 is the same.

Having described the operation of the apparatus shown in FIG. 2 during normal communication between CBX 100 and ROLMPhone 140, we will now describe the operation of the apparatus shown in FIG. 2 during the testing of telephone line 120 between CBX 100 and ROLMPhone 140.

In accordance with the present invention, microprocessor 400 interfaces with RLI/SLMR 115 to obtain the following information for use in performing a test for discontinuities or points of impedance mismatch which may exist in a line, for example, ROLMLink 120 between CBX 100 and Rolmphone 140: (a) an indication of whether a particular telephone set is idle and (b) the length of the telephone line which connects that telephone to CBX 100.

If the telephone set is idle, microprocessor 400 transmits a set of predetermined signals to pulse gen/det counter 260, which predetermined signals will be described in more detail below. In response to these predetermined signals, a counter within pulse gen/det counter 260 is set to a predetermined value which corresponds to a distance which is just short of the length of the telephone line to the particular telephone set. In a further embodiment of the present invention, microprocessor 400 transmits a signal to RLI/SLMR 115 and, in response, RLI/SLMR 115 sends a signal to telephone set 140 which causes telephone set 140 to assume a quiet, i.e., non-transmitting, mode. Then, pulse gen/det counter 260 transmits a testmode address signal over testmode bus 409, which testmode address signal is applied as input to TX MUX 290 over lead 411. The testmode address signal is also applied as input to comparator 350 over lead 377. In response to the testmode address signal: (a) TX MUX 290 outputs signals which are input thereto from pulse gen/det counter 260 over lead 410 and (b) comparator 350, as will be described in more detail below with respect to FIG. 4, introduces an offset into its output, which offset is high enough to maintain noise immunity in the reflected signal which is analyzed by this embodiment and which offset is low enough to permit the detection of a signal reflected from an impedance mismatch such as, for example, an impedance mismatch which is caused by a bridge tap, a bad connection, and so forth.

Next, pulse gen/det counter 260 generates a pulse over lead 410, which pulse is applied as input to TX MUX 290 for transmission on telephone line 120 towards ROLMPhone 140. At the same time, the counter in pulse gen/det counter 260 is stepped down under the control of a high speed clock. If a reflected signal is received by pulse gen/det counter 260 from comparator 350 over lead 420 before the counter reaches zero, pulse gen/det counter 260 sends a signal to microprocessor 400 to indicate that a defect has been detected in telephone line 120. Microprocessor 400 then: (a) logs a message for future viewing; (b) causes a message to be printed on a display terminal; (c) reports the status to CBX 100; and so forth. If, on the other hand, the counter reaches zero prior to the receipt of a reflected signal, the apparatus considers telephone line 120 to be without defect. Of course, as one of ordinary skill in the art should readily appreciate, an impedance mismatch caused by telephone 140 itself will not affect the test.

At the conclusion of the test, microprocessor 400 transmits a signal to RLI/SLMR 115 to cause it to remove ROLMPhone 140 from the quiet mode.

Figure 3:
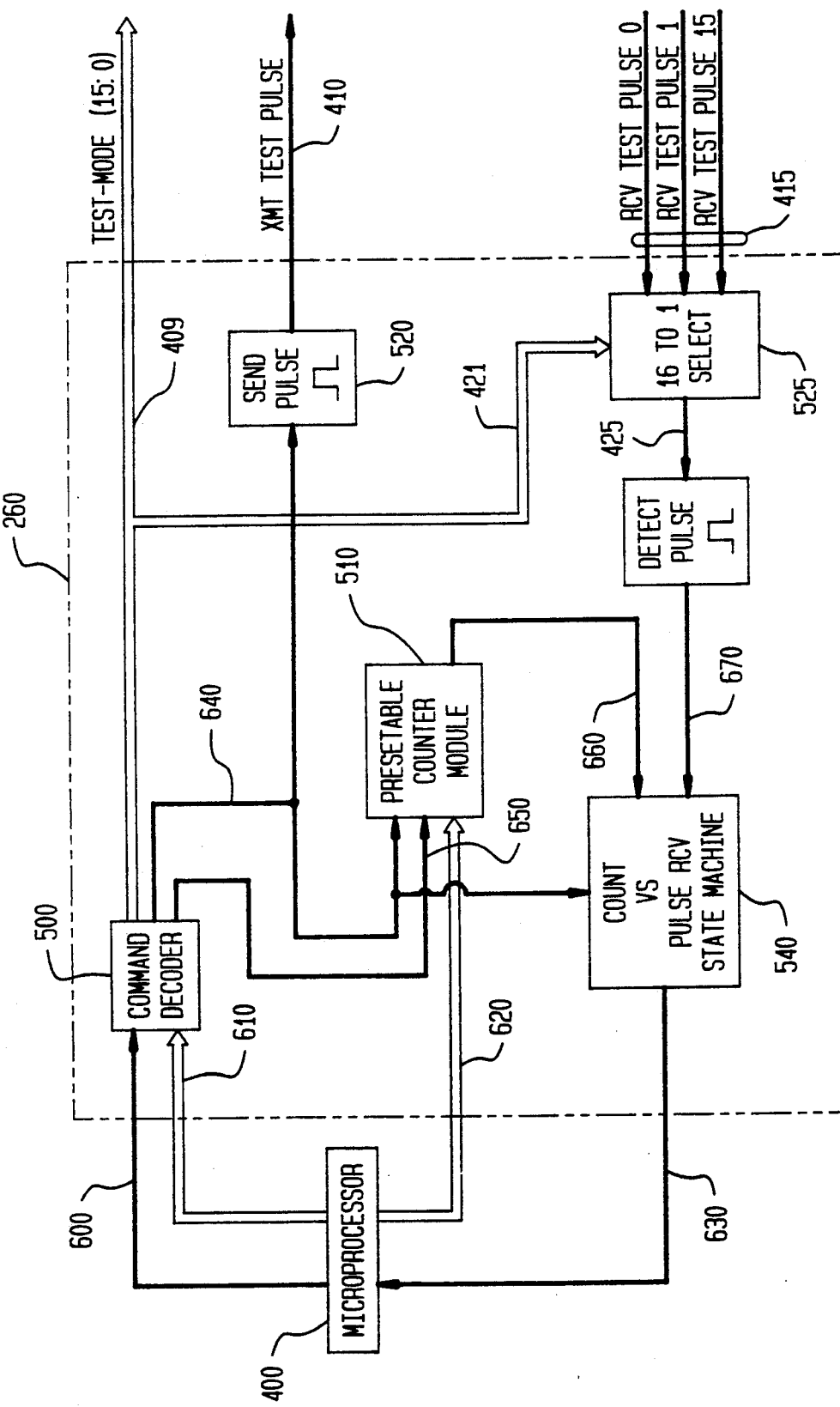
FIG. 3 is a block diagram of an embodiment of pulse gen/det counter 260 for use in the embodiment of the present invention shown in FIG. 2.

FIG. 3 is a block diagram of an embodiment of pulse gen/det counter 260. Note that clock signals have been omitted for ease of understanding. As shown in FIG. 3, microprocessor 400 transmits signals to pulse gen/det counter 260 in the form of (a) a select signal (DATA0) which is applied as input to command decoder 500 over lead 600; (b) an address signal which is applied as input to command decoder 500 over leads 610; and (c) a data signal which is applied as input to presetable counter module 510 over leads 620. The select signal awakens command decoder 500 so that it will be prepared to receive an address signal over leads 610. The address signal provides an address for one of the multiplicity of subscriber telephone sets, for example, sixteen (16) subscriber telephone sets, that are connected to RLI 115. Lastly, the data signal comprises information corresponding to the delay for a particular telephone line which is the subject of this test.

In response to the select and address signals being applied thereto over leads 600 and 610, respectively, command decoder 500 applies a testmode address signal to testmode bus 409, which testmode address signal is applied as input to TX MUX 290. In response to the testmode address signal: (a) TX MUX 290 outputs signals applied as input thereto over lead 410 from pulse gen/det counter 260 and (b) comparator 350 provides an offset in its output.

At the same time, command decoder 500 generates a load count signal which is applied as input to presetable counter module 510 over lead 650. In response to the load count signal, presetable counter module 510 is readied to receive the data signal over leads 620, which data signal corresponds to the predetermined count used in analyzing the test results for the particular telephone line which is being tested.

Next, after the data signal has been received by presetable counter module 510, command decoder 500 generates a start count/send pulse signal over lead 640 which is applied as input to: (a) presetable counter module 510; (b) send pulse module 520; and (c) count vs. pulse rcv state machine 540. In response: (a) presetable counter module 510 starts counting back from a value which represents a time period that is less than the time it takes for a pulse to travel from CBX 100 to ROLMPhone 140 and back again; (b) send pulse module 520 generates a digital pulse whose width is approximately $1.95 \times 10^{-6}$ sec and whose amplitude is approximately equal to a digital TTL level—it should be noted that these values are not critical and could be the same as a standard bit which is transmitted in the ROLMLin system, which digital pulse is applied to lead 410 as input to TX MUX 290; and (c) count vs. pulse rcv state machine 540 is initialized.

As shown in FIG. 2, in response to the digital pulse which is applied as input to TX MUX 290 over lead 410 and to the testmode address signal applied as input to TX MUX 290 over lead 411, TX MUX 290 applies the digital pulse to amplifiers 310 and 320. Then, as explained above, the digital pulse is applied to ROLMLink 120 which connects ROLMPhone 140 to CBX 110. If there is a defect or impedance mismatch in ROLMLink 120, a reflection of the transmitted pulse is detected by the inventive apparatus before the counter in presetable counter module 510 reaches zero. However, in accordance with the present invention, if there is no such defect, the reflected pulse will arrive after the counter in presetable counter module 510 reaches zero.

As shown in FIG. 2, a reflected pulse is applied, over lead 420, to RCV test pulse bus 415. Next, with reference to FIG. 3, the output from RCV test pulse bus 415 and the outputs from testmode bus 409 are applied as input to 16-to-1 select 525 over leads 421. In response, the reflected pulse applied as input to RCV test pulse bus 415 over lead 420 is, in turn, applied as input to detect pulse 530 over lead 425. Detect pulse module 530 detects a pulse input thereto over lead 425 and, in response, generates a signal which is applied as input to count vs. pulse rcv state machine 540 over lead 670 to indicate the receipt of a pulse.

Count vs. pulse rcv state machine 540 receives an input from presetable counter module over lead 660 whenever the count expires. As a result, count vs. pulse rcv state machine 540 determines whether the reflected pulse was detected before or after the count expired. If the reflected pulse is detected after the counter expired, i.e., an expired count signal is received on lead 660 from presetable counter module 510 before a signal is received on lead 670 from detect pulse 530, count vs. pulse rcv state machine 540 generates a signal which is applied as input to microprocessor 400 over lead 630 to indicate that no defect was detected. If, on the other hand, the reflected pulse is detected before the counter has expired, i.e., an expired count signal is received on lead 660 from presetable counter module 510 after a signal is received on lead 670 from detect pulse 530, then count vs. pulse rcv state machine 540 generates a signal which is applied as input to microprocessor 400 over lead 630 to indicate that a defect was detected. In response, microprocessor 400 may generate a message which is printed, or displayed on a terminal, and/or which is logged for future analysis by applications processes in CBX 10. In addition, in further embodiments of the present invention, in response to a read count signal from microprocessor 400, presetable counter module 510 may transmit the value of the counter to microprocessor 400 over an additional data bus where it is translated into a distance in a manner which is well known to those of ordinary skill in the art so that the distance of the detected defect from CBX 100 may be reported. If a 13 MHz clock and a seven (7) bit counter are utilized in this embodiment, a typical ROLMLink has a distance which corresponds to 128 ticks of the clock. As such, a typical ROLMLink would be divided into 128 sections and a sectionalization of a defect would be to one of the 128 sections. Count vs. pulse rcv state machine 540 as is well known to those of ordinary skill in the art may be fabricated as common logic, as a state machine, or in a microprocessor.

Figure 4:
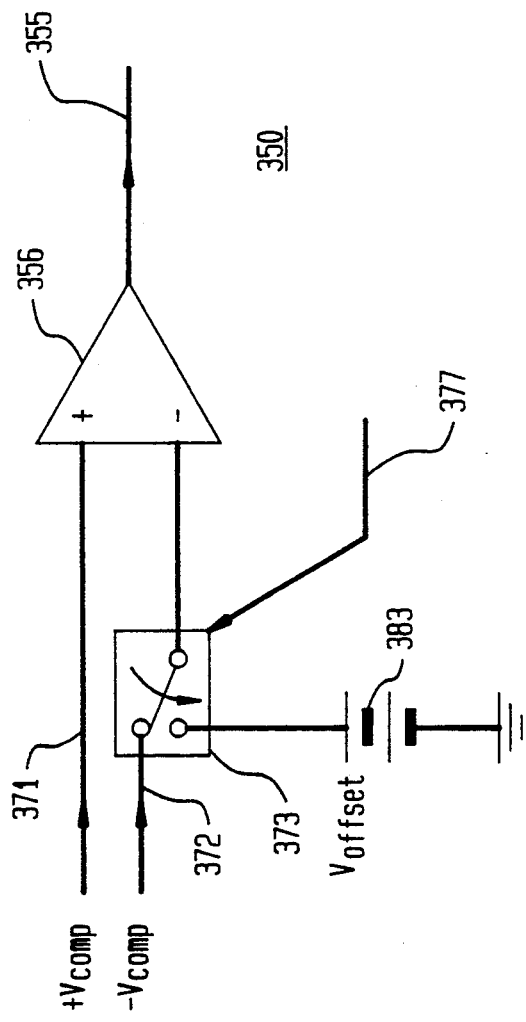
FIG. 4 is a block diagram of an embodiment of comparator 350 for use in the embodiment of the present invention shown in FIG. 2.

FIG. 4 is a block diagram of an embodiment of comparator 350. As shown in FIG. 4, signals +Vcomp and −Vcomp which are output from hybrid network 330 in response to signals received over ROLMLink 120 are applied as input to comparator 350 over leads 371 and 372, respectively. As shown in FIG. 4, signal +Vcomp is applied as input to amplifier 356 and signal −Vcomp is applied as input to switch 373. The testmode address signal which is generated by pulse gen/det counter 260 is applied as input to switch 373 over lead 377. Finally, the output from voltage source 383 is applied as input to switch 373. In response to the testmode address signal, whenever a test is being made, the output from voltage source 383 is applied as input to amplifier 356 whereas, under normal circumstances, signal −Vcomp is applied as input to amplifier 356.

Figure 5:
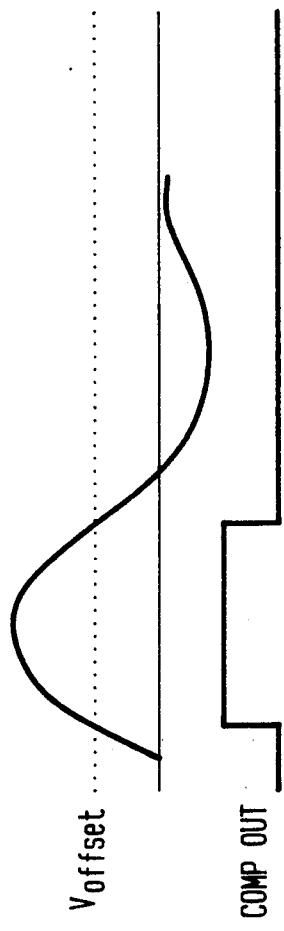
FIG. 5 is a graphical representation of a test pulse reflection received by the embodiment of the present invention shown in FIG. 2.

FIG. 5 is a graphical representation of a test pulse reflection received over lead 371 as +Vcomp input to comparator 350. As shown in FIG. 5, voltage source 383 introduces an offset in the output of comparator 350 whenever a test is being made. The offset is set high enough so that noise immunity is maintained and, at the same time, the offset is low enough to be able to detect gross impedance mismatches in the telephone line.

Figure 6:
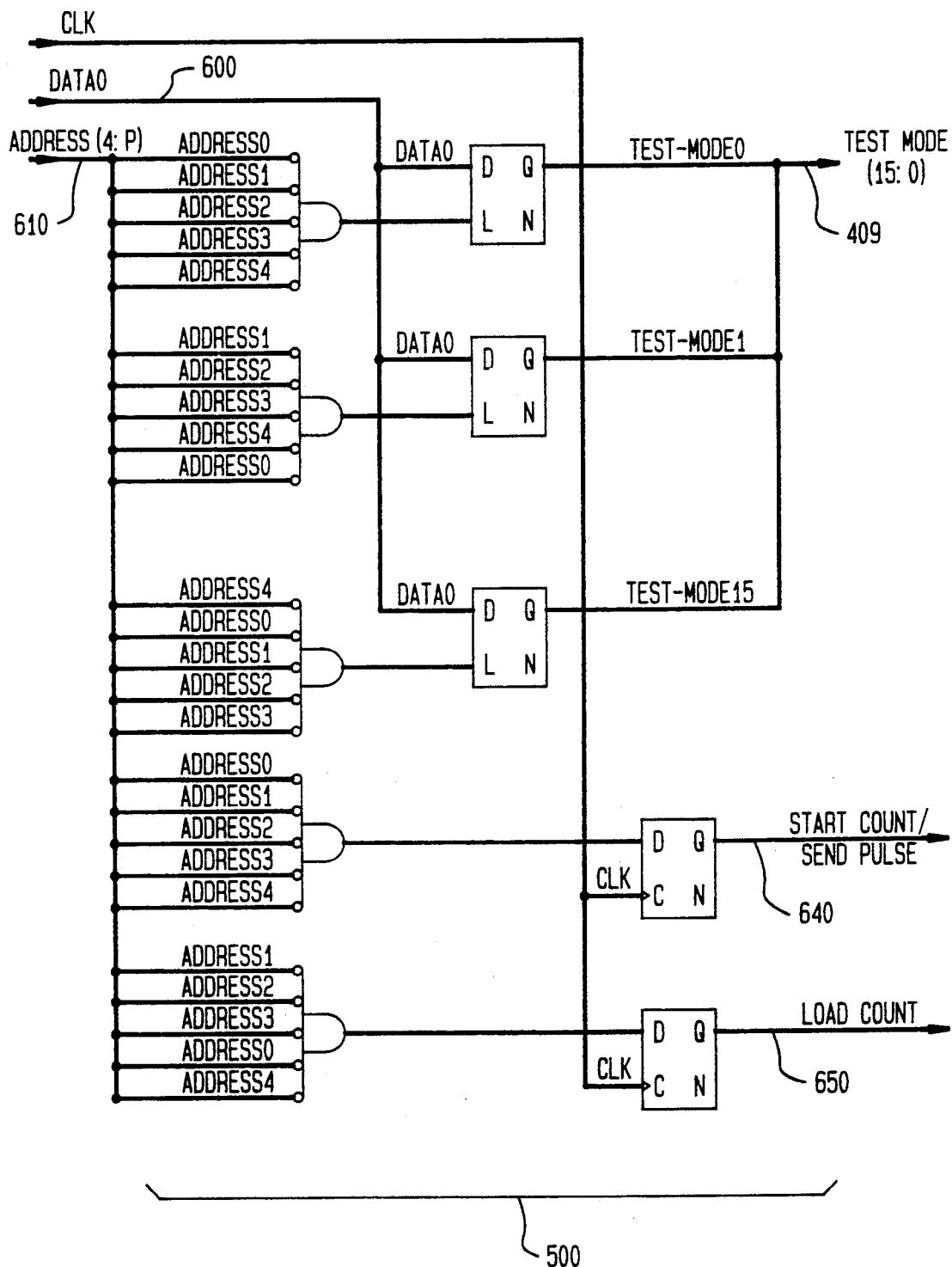
FIG. 6 is a block diagram of an embodiment of command decoder 500 which comprises a portion of the embodiment of pulse gen/det counter 260 shown in FIG. 3.

FIG. 6 is a block diagram of an embodiment of command decoder 500 in a form which can readily be understood by those of ordinary skill in the art.

Figure 7:
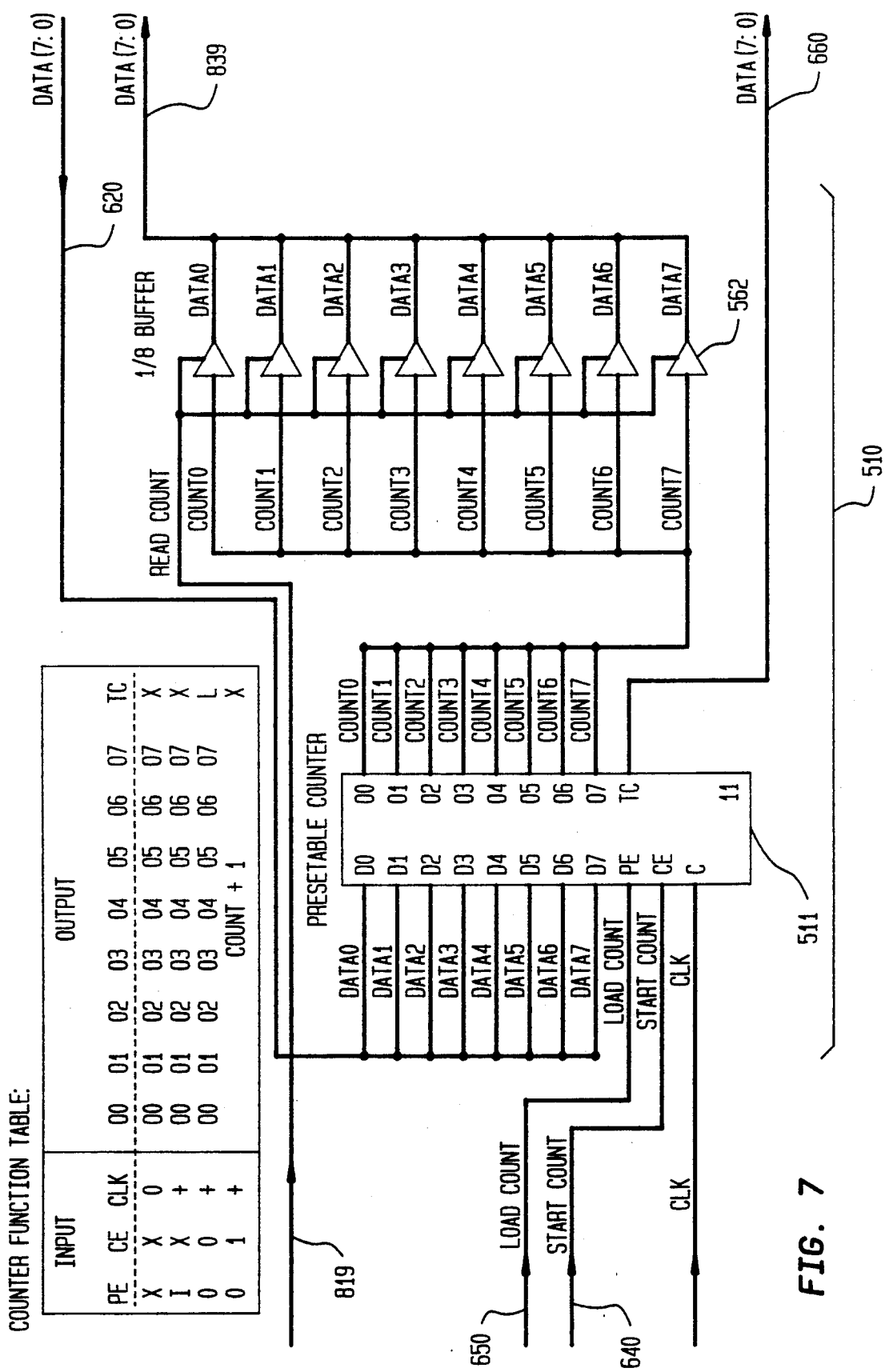
FIG. 7 is a block diagram of an embodiment of presetable counter module 510 which comprises a portion of the embodiment of pulse gen/det counter 260 shown in FIG. 3.

FIG. 7 is a block diagram of an embodiment of presetable counter module 510 in a form which can readily be understood by those of ordinary skill in the art. As shown in FIG. 7, presetable counter module 510 comprises presetable counter 511 and tri-state buffer 512 (T/S buffer 512). Also shown in FIG. 7 is a counter function table which provides a format for operation thereof in a form which is well understood by those of ordinary skill in the art. T/S buffer 512 applies the value of counter 511 to data bus 839 in response to read count signal 819 from microprocessor 400 for use in the alternative embodiment discussed above wherein the distance to the defect may be ascertained.

Figure 8:
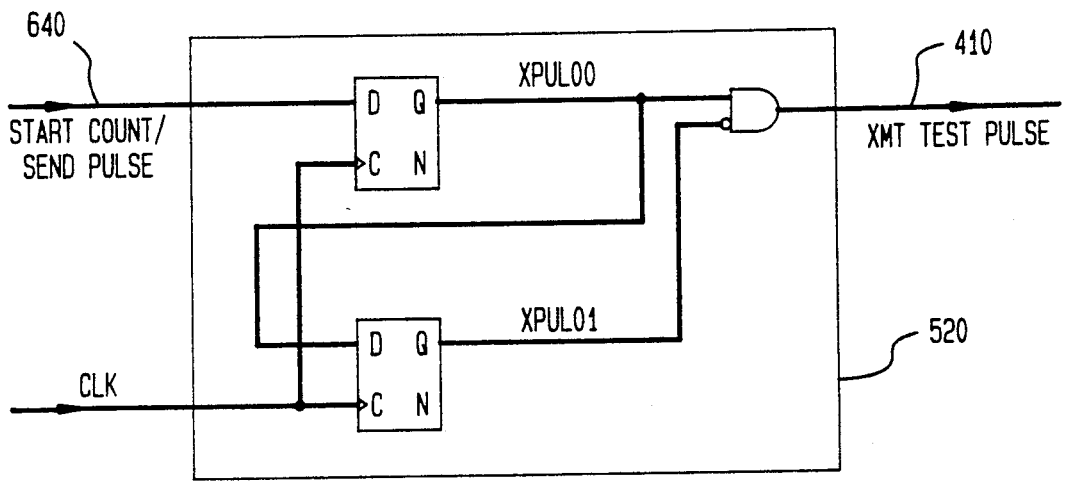
FIG. 8 is a block diagram of an embodiment of send pulse 520 which comprises a portion of the embodiment of pulse gen/det counter 260 shown in FIG. 3.

FIG. 8 is a block diagram of an embodiment of send pulse 520 in a form which can readily be understood by those of ordinary skill in the art.

Figure 9:
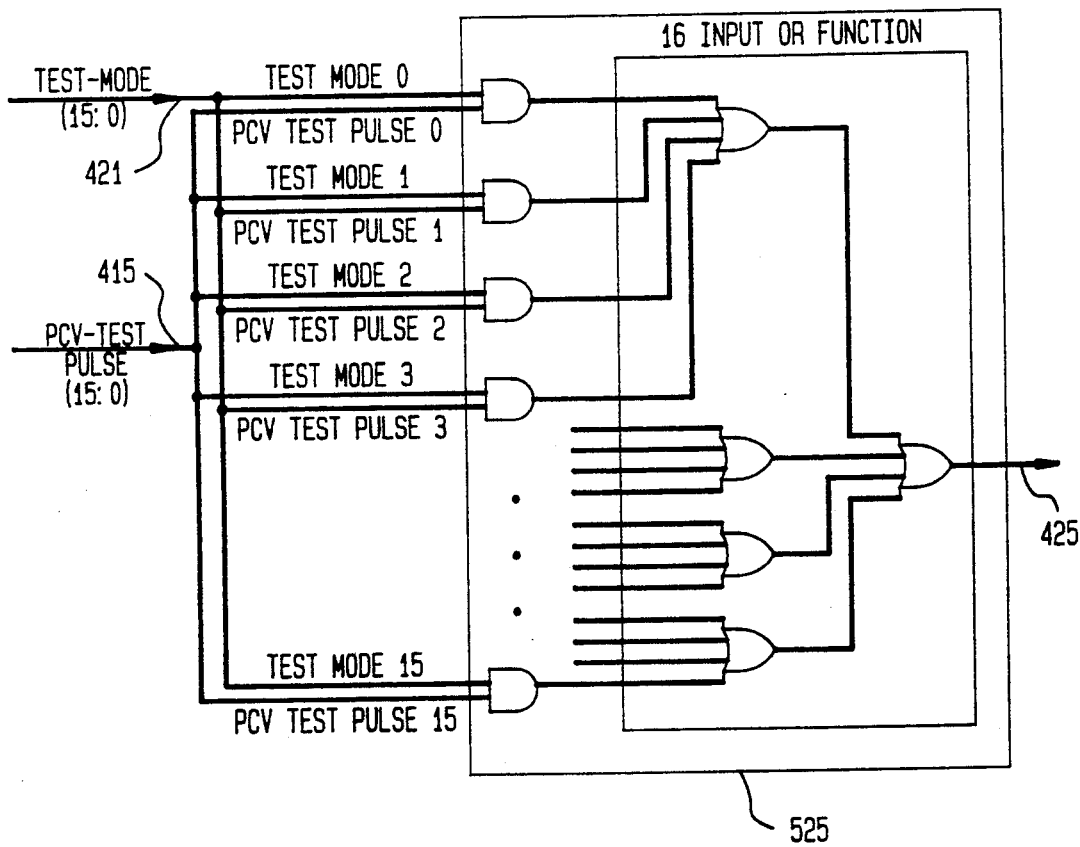
FIG. 9 is a block diagram of an embodiment of 16-to-1 select 525 which comprises a portion of the embodiment of pulse gen/det counter 26 shown in FIG. 3.

FIG. 9 is a block diagram of an embodiment of 16-to-1 select 525 in a form which can readily be understood by those o ordinary skill in the art.

Figure 10:
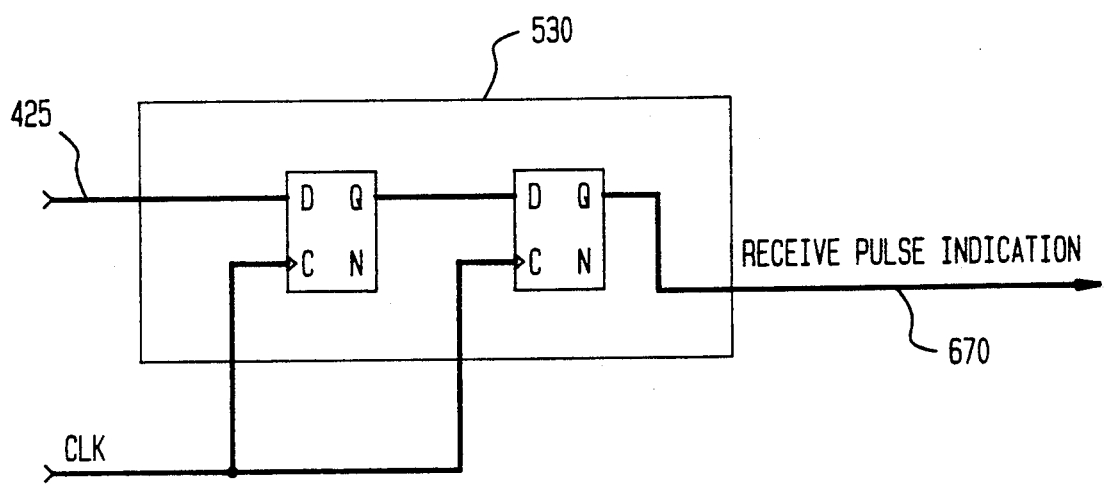
FIG. 10 is a block diagram of an embodiment of detect pulse 530 which comprises a portion of the embodiment of pulse gen/det counter 260 shown in FIG. 3.

FIG. 10 is a block diagram of an embodiment of detect pulse 530 in a form which can readily be understood by those of ordinary skill in the art.

Figure 11:
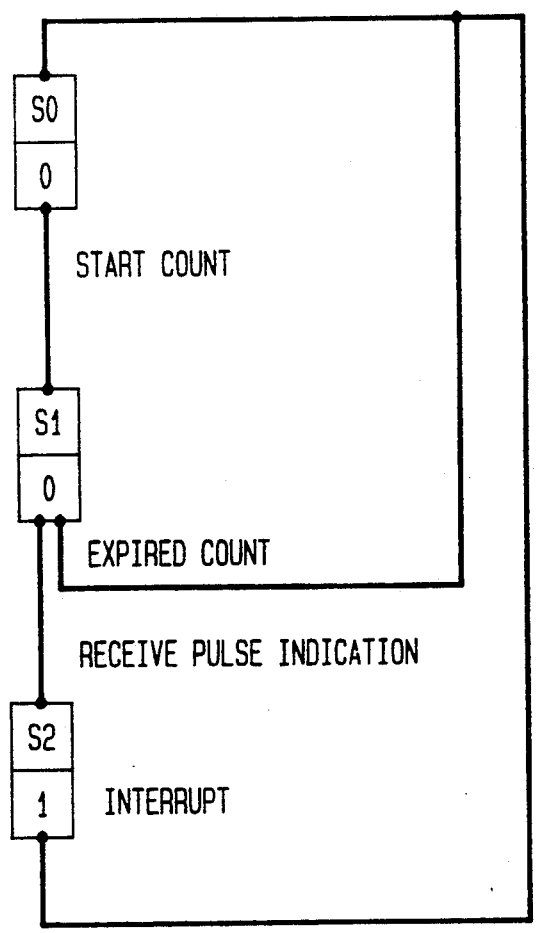
FIG. 11 is a block diagram of a state diagram for an embodiment of count vs. pulse state machine 540 which comprises a portion of the embodiment of pulse gen/det counter 260 shown in FIG. 3.

Lastly, FIG. 11 is a block diagram of a state diagram for an embodiment of count vs. pulse rcv state machine 540. As shown in FIG. 11, state machine 540 comprises three states and can be fabricated in accordance with methods which are well known to those of ordinary skill in the art.

Further, those skilled in the art recognize that further embodiments of the present invention may be made without departing from its teachings. For example, in further embodiments of the present invention, the time of receipt of the reflection may be translated into a length which corresponds to the location of the defect as a distance along the telephone line from the switching machine. For example, it should be clear to those of ordinary skill in the art that a counter which runs at 18 MHz can be used to provide a timing function which could provide a length measurement having an accuracy of approximately twenty-five (25) feet.

In further embodiments of the present invention, in a line where there may be several discontinuities, a measurement of the distance to the first such discontinuity is made by varying the length of the predetermined time period. Specifically, in the first instance the time period corresponds to a length which is just short of the telephone set. If a defect is detected, the time period is shortened and pulses are emitted until no reflection is detected prior to the expiration of the shortened time period. Then, by keeping track of this test sequence, one determines that the last time period which resulted in a received reflection before the expiration thereof corresponds to the first defect along the telephone line in the direction starting from the switching machine and traveling towards the telephone set. As one of ordinary skill in the art can readily appreciate, this latter embodiment is useful in estimating the distance to the end of an open telephone line.

What is claimed is:

1. Apparatus for detecting and sectionalizing troubles on a telephone line of predetermined length, which apparatus comprises:
   means for emitting a pulse over the telephone line;
   means for detecting a reflection of the pulse; and
   means, responsive to the emitting means and the detecting means, for determining whether the reflection was detected prior to the expiration of a time period which starts substantially at the time the pulse is emitted, the time period corresponding to a length of time which is less than the length of time it would take such a pulse to travel a distance over the telephone line from the emitting means substantially to the end of the telephone line and back to the detecting means, which distance is substantially equal to twice the predetermined length.

2. The apparatus of claim 1 wherein the determining means comprises counter means for counting predetermined portions of the time period.

3. The apparatus of claim 2 wherein the counter means starts counting in response to a signal from the emitting means.

4. Apparatus for detecting and sectionalizing troubles on a telephone line which comprises:
   means for emitting a pulse over the telephone line;
   means for detecting a reflection of the pulse; and
   means, responsive to the emitting means and the detecting means, for determining whether the reflection was received prior to the expiration of a predetermined time period,
   wherein the determining means comprises counter means for counting predetermined portions of the predetermined time period, which counter means starts counting in response to a signal from the emitting means, and
   wherein the determining means determines that a defect has occurred whenever it receives a signal from the detecting means prior to the counter means having counted a predetermined amount which corresponds to the predetermined time period.

5. The apparatus of claim 4 which further comprises means, responsive to the determining means, for causing a display whenever a defect is detected.

6. The apparatus of claim 1 which further comprises means for varying the time period.

7. The apparatus of claim 4 which further comprises means for determining the count when the determining means receives a signal from the detecting means.

8. The apparatus of claim 7 which further comprises means, responsive to the count, for determining the distance to the defect.

9. Method for detecting and sectionalizing troubles on a telephone line of predetermined length, which method comprises the steps of:
   emitting a pulse over the telephone line;
   detecting a reflection of the pulse; and
   determining whether the reflection was detected prior to the expiration of a time period which starts substantially at the time the pulse is emitted, the time period corresponding to a length of time which is less than the length of time it would take such a pulse to travel a distance over the telephone line from one end and back, which distance is substantially equal to twice the predetermined length.

* * * * *